(12) United States Patent
Jing

(10) Patent No.: US 8,022,738 B2
(45) Date of Patent: *Sep. 20, 2011

(54) APPARATUS AND METHOD FOR DETECTING THE LOSS OF AN INPUT CLOCK SIGNAL FOR A PHASE-LOCKED LOOP

(75) Inventor: Tao Jing, Fremont, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/488,989

(22) Filed: Jun. 22, 2009

(65) Prior Publication Data
US 2009/0256600 A1 Oct. 15, 2009

Related U.S. Application Data

(63) Continuation of application No. 11/694,861, filed on Mar. 30, 2007, now Pat. No. 7,567,100.

(51) Int. Cl.
*H03L 7/06* (2006.01)
(52) U.S. Cl. ......... 327/156; 327/18; 327/147; 327/150
(58) Field of Classification Search .............. 327/18, 327/147, 150, 156
See application file for complete search history.

(56) References Cited

U.S. PATENT DOCUMENTS

| 5,886,582 | A | 3/1999 | Stansell | |
|---|---|---|---|---|
| 6,473,478 | B1 * | 10/2002 | Wallberg et al. | 375/376 |
| 6,745,338 | B1 | 6/2004 | Williams | |
| 2005/0110526 | A1 * | 5/2005 | Ishibashi et al. | 327/18 |

OTHER PUBLICATIONS

ICS620-21 Low Power Redundant Synchronizing DSP Clock Generator; Integrated Circuit Systems, Inc.; Revised May 16, 2006; pp. 1-8; San Jose, CA.

* cited by examiner

*Primary Examiner* — Lincoln Donovan
*Assistant Examiner* — John W Poos
(74) *Attorney, Agent, or Firm* — Panitch, et. al

(57) ABSTRACT

An apparatus is provided for detecting the loss of an input clock signal for a phase-locked loop (PLL). The apparatus includes a time delay circuit, a first frequency divider and a digital logic circuit. The time delay circuit receives the input clock signal and outputs a first time-delayed clock signal. The first frequency divider receives an input signal from an internal clock of the PLL and outputs a clock signal having the same frequency or a lower frequency than that of the time-delayed clock signal. The digital logic circuit that receives the first frequency divider output signal and the first time-delayed clock signal and outputs a signal indicating the loss of the input clock signal if there is no first time-delayed clock signal for a cycle of the first frequency divider output signal.

23 Claims, 3 Drawing Sheets

APPARATUS AND METHOD FOR DETECTING THE LOSS OF AN INPUT CLOCK SIGNAL FOR A PHASE-LOCKED LOOP

CROSS-REFERENCE TO RELATED APPLICATIONS

This application is a continuation of U.S. application Ser. No. 11/694,861 filed Mar. 30, 2007, which is incorporated herein by reference.

BACKGROUND OF THE INVENTION

A Phase-Locked Loop (PLL) is a closed-loop control circuit that produces an output signal which bears a relation to the frequency and phase of an input signal. The input signal is often considered a reference signal. A PLL can be of digital (DPLL) or analog (APLL) design. Each design has somewhat different structure, but both perform the same function. The reference signal is typically called an input clock signal (INCLK). Often, it is necessary for the PLL to take an action when the INCLK is lost. A conventional circuit for detecting the loss of an input clock is shown in diagram form in FIG. 1. In this circuit, the voltage at node F (Vf) is compared in the COMPARATOR circuit to determine if Vf bears a predetermined relationship with either a pre-designated voltage or a threshold voltage determined from the Vdd voltage of an inverter that can be incorporated within the COMPARATOR circuit. If the comparison between Vf and the pre-designated voltage or the threshold voltage falls outside of a particular tolerance, then the NOCLK output is triggered to signal that the INCLK has been lost. Circuits like those shown in FIG. 1 are problematic in determining the loss of INCLK because they are analog and Vf is dependent on factors such as the value of resistor R, the value of capacitor C, the combined resistive/capacitive (RC) effect, the delay $t_d$ circuit, the NAND gate A, the circuit's Vdd voltage, and temperature. It is desirable to provide a digital circuit that is capable of detecting the loss of the INCLK of a PLL that does not rely on voltage references that are influenced by factors prevalent in analog circuits such as shown in FIG. 1.

BRIEF SUMMARY OF THE INVENTION

A first embodiment of the present invention detects the loss of an input clock signal for a phase-locked loop (PLL). A time delay circuit receives the input clock signal and outputs a first time-delayed clock signal. A frequency divider receives an input signal from an internal clock of the PLL and outputs a clock signal having the same frequency or a lower frequency than that of the time-delayed clock signal. A digital logic circuit receives the first frequency divider output signal and the first time-delayed clock signal and outputs a signal indicating the loss of the input clock signal if there is no first time-delayed clock signal for a cycle of the first frequency divider output signal.

Another embodiment of the present invention detects the loss of an input clock signal for a phase-locked loop (PLL). A time delay circuit receives the input clock signal and outputs a first time-delayed clock signal. A first frequency divider receives an input signal from an internal clock of the PLL and outputs a clock signal having the same frequency or a lower frequency than that of the time-delayed clock signal. A plurality of digital logic circuits each receive the first frequency divider output signal and the first time-delayed clock signal and output a signal indicating the loss of the input clock signal if there is no first time-delayed clock signal for a cycle of the first frequency divider output signal.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
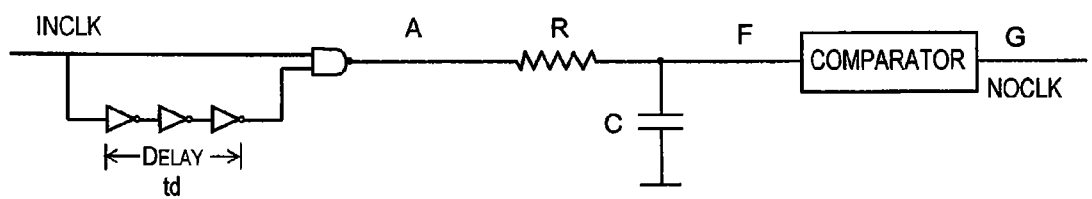
FIG. 1 is a schematic diagram of a conventional PLL input clock loss detection circuit.
Figure 2:
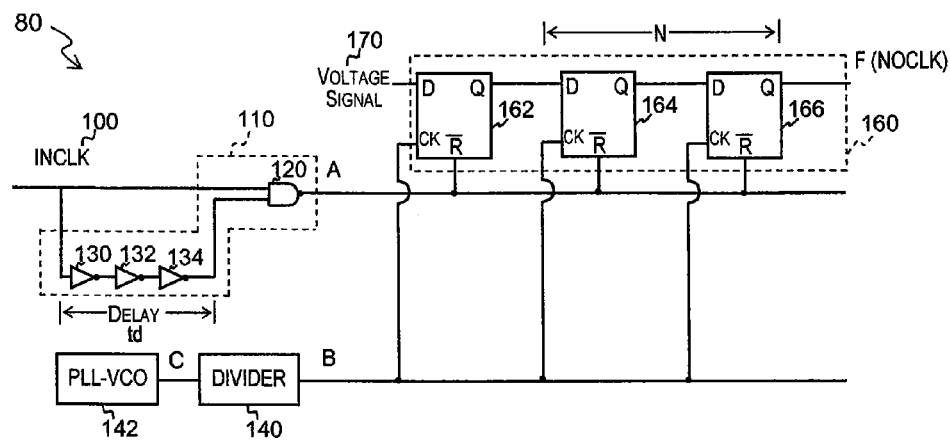
FIG. 2 is a schematic diagram of a PLL input clock loss detection circuit in accordance with the preferred embodiments of the present invention.

Referring to the drawings in detail, wherein like reference numerals indicate like elements throughout, FIG. 2 shows a circuit 80 configured to detect the loss of an input clock signal 100 for a phased lock loop (PLL). Circuit 80 contains a time delay circuit 110, configured to generate a first time-delayed signal A of the input clock signal 100. FIG. 4 shows an exemplary input clock signal 100 waveform and a corresponding first time-delayed signal A waveform. Time delay circuits of different configurations may be used, however the time delay circuit must not alter the frequency of the input clock signal 100. The input clock signal 100 is commonly referred to as "INCLK" or "ICLK". In the embodiments shown in FIGS. 2 and 3, time delay 110 includes logic gates 120, 130 having an input terminal receiving the input clock signal 100 and logic gate 120 having an output terminal transmitting signal A. Preferably, logic gate 120 is a NAND type logic gate and logic gate 130 is an inverter logic gate. Time delay circuit 110 will also preferably comprise inverter logic gates 132 and 134 connected as shown to provide the time delay $t_d$. Circuit 80 also contains a first frequency divider 140 configured to generate a signal B having the same frequency as signal A or a lower frequency than signal A. The first frequency divider 140 includes input terminal receiving a signal C corresponding to the internal clock of the PLL and output terminal transmitting signal B.

Signal C may be generated by a voltage controlled oscillator (VCO) 142 of the PLL or signal C may be generated by a numerically controlled oscillator (NCO). When the PLL is operational, the phase relation between INCLK and signal C is fixed by a constant, but the frequency of signal C is not necessarily the same as INCLK. For example, where INCLK is 10 Megahertz (MHz), signal C may be 200 MHz. An integer constant frequency divider incorporated into the first frequency divider 140 can provide for a signal B that has a frequency of 10 MHz. Further, in the event that signal C is of a lower frequency than INCLK, a fractional divider constant can be used to increase the frequency of signal B to a value equal to the frequency of INCLK, or lower than the frequency of INCLK but still higher than the frequency of signal C, effectively making the first frequency divider 140 a multiplier.

Circuit 80 also contains a plurality of digital logic circuits 160 that are configured to generate a signal F indicating a status of the input clock signal 100. The plurality of digital logic circuits 160 includes digital logic circuit 162 having an input terminal receiving signal A, an input terminal receiving signal B, an input terminal receiving a voltage signal 170 and an output terminal transmitting signal F. Typically, the voltage signal 170 is a logic "1" or logic "high" or a Vdd voltage. When the voltage signal 170 is a logic 1 or Vdd voltage, signal F is output as high to indicate the loss of INCLK. However, in an alternative embodiment, voltage signal 170 may be a logic "0" or "low" or a Vss voltage. When the voltage signal 170 is a logic 0 or Vss voltage, signal F is output as low to indicate the loss of INCLK.

Preferably, the digital logic circuit 162 is a delay flip-flop with reset function (DFFR). The plurality of digital logic circuits 160 can also include N additional digital logic circuits interconnected in a cascade with the digital logic circuit 162 such that the output of digital logic circuit 162 serves as the logic input for the second digital logic circuit 164 and the output of digital logic circuit 164 serves as the logic input for digital logic circuit 166 and so on, up to and including an Nth digital logic circuit. The additional digital logic circuits, from digital logic circuit 164 to digital logic circuit N, are connected to signal A and signal B in the same way that digital logic circuit 162 is connected to signals A and B. The output on the Nth digital logic circuit is signal F, where signal F indicates the status of time delayed input clock signal A as compared to the PLL internal clock represented by signal B. Thus signal F serves as a status indication of input clock signal 100. In one embodiment of circuit 80, the circuit does not contain a plurality of digital logic circuits 160 but does contain digital logic circuit 162, where digital logic circuit 162 functions in the manner described previously and in the remainder of this specification. In other words, N can be zero.

Specifically, for one embodiment, the logic input of digital logic circuit 162 is connected to a Vdd voltage or logic 1. The clock input of all digital logic circuits in the plurality of digital circuits 160, or in other words, all digital logic circuits in the cascade, are connected to the output signal of the first frequency divider 140. The reset input of all digital logic circuits in the cascade are connected to the first time-delayed signal A. The logic input of each digital logic circuit in the cascade after digital logic circuit 162 is connected to the logic output of the predecessor digital logic circuit in the cascade.

The value of N is subjective to the user, and typically is based on the user's judgment regarding how many cycles of signal B beyond the first cycle are to be missed before a predetermined action is taken. For example, in operation, at a time that there is no input clock signal 100, depending on the time delay circuit 110, signal A will be high, meaning a high signal will be applied to the digital logic circuit 162 reset input. Digital logic circuit 162, which in one embodiment always receives a logic high at its logic signal input, will produce a high logic signal output after the first positive transitional of signal B received at the clock input. For purposes of this specification, outputting a logic signal includes outputting a low or a high signal.

Where N is not equal to zero, the high logic signal output of the first digital logic circuit 162 propagates to the logic input of the next digital logic circuit 164 when, in the next positive transitional clock cycle of signal B received at the clock input of digital logic circuit 164, the logic output of digital logic circuit 164 will be output as high. If N>1, then the high logic output of digital logic circuit 164 will propagate to the logic input of digital logic circuit 166 where at the third positive transitional clock cycle of signal B, the logic output signal of digital logic circuit 166 will be set high. This propagation continues to the Nth digital logic circuit and, at the N+1 cycle of signal B, the logic output of the Nth digital logic circuit is set high. The logic output of the Nth digital logic circuit is signal F. Where signal A is low at the reset input of any of the digital logic circuits in the cascade, the logic output of those digital logic circuits will be low, despite the value of those digital logic circuit's logic input or clock input.

Figure 3:
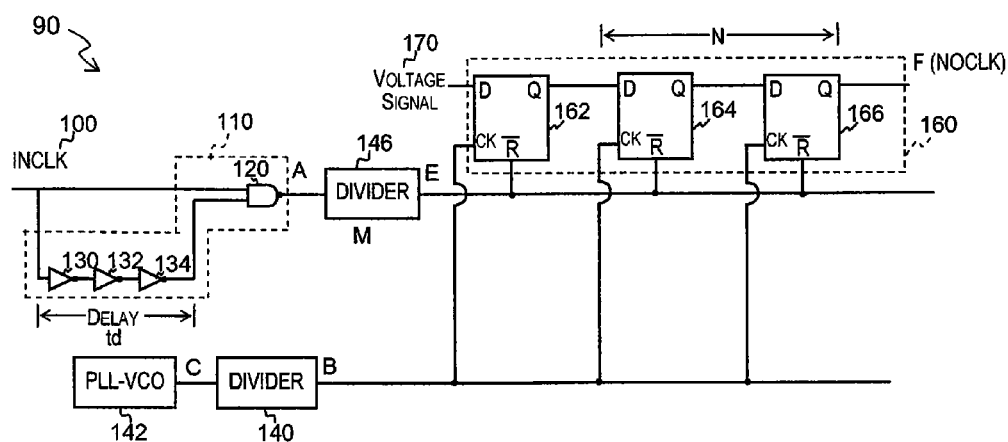
FIG. 3 is a schematic diagram of a PLL input clock loss detection circuit in accordance with the preferred embodiments of the present invention.
Figure 4:
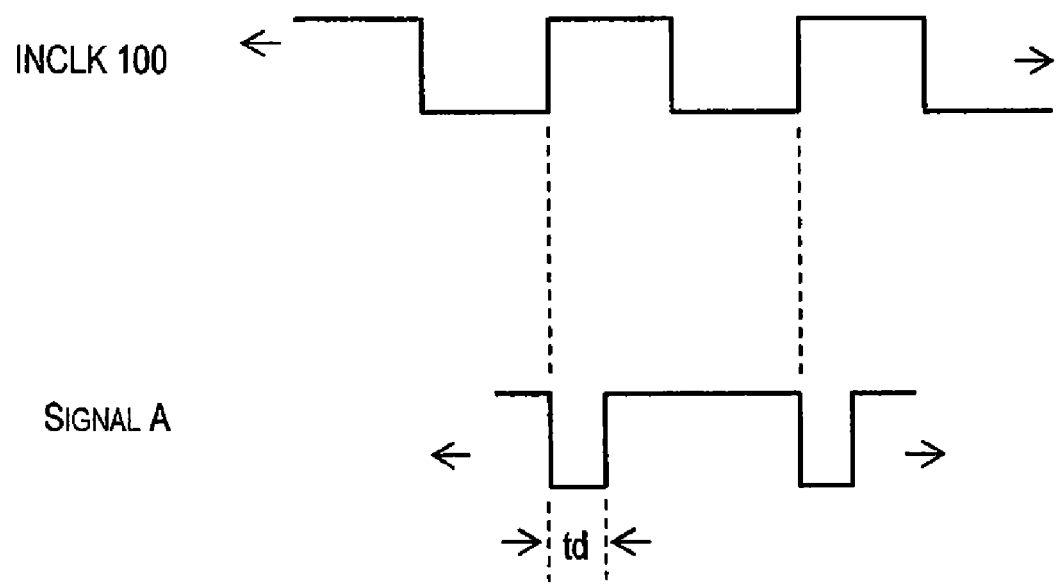
FIG. 4 is a diagram of the waveform of a PLL input clock signal and the waveform of the input clock signal's corresponding time-delayed signal.

Referring to FIG. 3, circuit 90 is also configured to detect the loss of an input clock signal 100 for a phase lock loop (PLL). Circuit 90 discloses a second frequency divider 146. The second frequency divider 146 includes input terminal receiving signal A, signal A being the same as in circuit 80, and output terminal for transmitting signal E, signal E being a second time-delayed clock signal and having a lower frequency than that of signal A or having the same frequency as signal A. Second frequency divider 146 has a constant M associated with it indicating the divisor constant of second frequency divider 146. M can be 1 or any other integer number. Circuit 90 is configured much in the same way as circuit 80 is configured, with one exception being that signal E takes the place of signal A regarding the connections to the reset inputs of the digital logic circuits that comprise the plurality of digital logic circuits 160. Further, the first frequency divider 140 produces a signal B that has the same frequency as signal E or a lower frequency than signal E. Signal E allows the circuit 90 to tolerate more missing cycles of the INCLK without outputting signal F which indicates the loss of the INCLK. Signal F will indicate a loss of INCLK after input clock 100 has been lost for M(N+1) cycles of signal B. In one embodiment of circuit 90, the circuit does not contain a plurality of digital logic circuits 160 but does contain digital logic circuit 162, where digital logic circuit 162 functions in the manner described previously and in the remainder of this specification. In other words, N can be zero.

In both circuits 80 and 90, the effect of having a signal B with a lower frequency than that of either signal A or signal E, respectively, is that it will take a longer time for a loss of INCLK, or any input clock 100 state change, to propagate through the plurality of digital logic circuits 160. The end user may desire a longer processing time for certain applications. Also, both the first and second frequency dividers 140 and 146 may be programmable in that the divider constant can be changed via a signal external of the frequency dividers 140 and 146.

Circuits 80 or 90 may be used in a method of signaling a PLL based system to take a predetermined action upon the loss of the input clock signal 100. One method using circuit 80 includes generating time-delayed signal A of input clock signal 100 via time delay circuit 110, and then generating signal B, having the same or lower frequency than that of signal A, from first frequency divider 140. Signal F, indicating a status of input clock signal 100, is generated from N+1 digital logic circuit of the plurality of digital logic circuits 160. Signal F is then transmitted to the PLL-based system, wherein the PLL-based system is configured to take a predetermined action upon receiving a predetermined status of signal F. The typical predetermined status of signal F is one that indicates the INCLK has been lost. Depending on the exact configuration of circuit 80, for a loss of INCLK signal F could be high or low. Preferably, in one embodiment, the PLL-based system powers down when signal F is high. This means that the input clock signal 100 has been lost for N+1 cycles of signal B. Other predetermined actions that the PLL-based system may take are to power down a certain chip or to switch to a backup INCLK. Another embodiment of a method of powering down a PLL-based system employing the circuit 90 includes additionally generating signal E, a second time-delayed clock signal, from a second frequency divider 146, where signal E has the same or lower frequency than signal A. Also, the signal B generated from first frequency divider 140 will have the same or lower frequency than that of signal E. Signal F will indicate a loss of INCLK after input signal 100 is not detected for M(N+1) cycles of signal B. The rest of the method is the same as the method disclosed in association with circuit 80.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. An apparatus for detecting the loss of an input clock signal for a phase-locked loop (PLL), the apparatus comprising:
   (a) a time delay circuit that receives the input clock signal and outputs a first time-delayed clock signal;
   (b) a first frequency divider that receives an input signal from an internal clock of the PLL and outputs a clock signal having the same frequency or a lower frequency than that of the time-delayed clock signal; and
   (c) a plurality of digital logic circuits that each receive the first frequency divider output signal and the first time-delayed clock signal and output a signal indicating the loss of the input clock signal if there is no first time-delayed clock signal for a cycle of the first frequency divider output signal.

2. The apparatus of claim 1, further comprising
   (d) a second frequency divider that receives the first time-delayed clock signal and outputs a second time-delayed clock signal having a lower frequency or the same frequency as that of the first time-delayed clock signal, and
   wherein each of the plurality of digital logic circuits receives the first frequency divider output signal and the second time-delayed clock signal and outputs a signal indicating the loss of the input clock signal if there is no second time-delayed clock signal for a cycle of the first frequency divider output signal.

3. The apparatus of claim 2, wherein the plurality of digital logic circuits includes N+1 digital logic circuits, and
   the N+1 digital logic circuits are connected in a cascade, and
   the output of the N+1 digital logic circuit being used to output the loss of the input clock signal to a device outside the apparatus.

4. The apparatus of claim 3, wherein the digital logic circuits are delay flip-flops with a reset function (DFFR), and
   the logic input of the first DFFR in the cascade is a logic high or a Vdd voltage,
   the clock input of each DFFR in the cascade is connected to the output signal of the first frequency divider,
   the reset input of each DFFR in the cascade is connected to the second time-delayed clock signal,
   the logic input of each DFFR in the cascade after the first DFFR is connected to the logic output of the predecessor DFFR in the cascade, and
   the logic output of the N+1 digital logic circuit being high indicates the loss of the input clock signal.

5. The apparatus of claim 3, wherein the digital logic circuits are delay flip-flops with a reset function (DFFR), and
   the logic input of the first DFFR logic circuit in the cascade is a logic low or a Vss voltage,
   the clock input of each DFFR in the cascade is connected to the output signal of the first frequency divider,
   the reset input of each DFFR in the cascade is connected to the second time-delayed clock signal,
   the logic input of each DFFR in the cascade after the first DFFR is connected to the logic output of the predecessor DFFR in the cascade, and
   the logic output of the N+1 digital logic circuit being low indicates the loss of the input clock signal.

6. The apparatus of claim 1, wherein the plurality of digital logic circuits includes +1 digital logic circuits, and
   the N+1 digital logic circuits are connected in a cascade, and
   the output of the N+1 digital logic circuit being used to output the loss of the input clock signal to a device outside the apparatus.

7. The apparatus of claim 6, wherein the digital logic circuits are delay flip-flops with a reset function (DFFR), and
   the logic input of the first DFFR in the cascade is a logic high or a Vdd voltage,
   the clock input of each DFFR in the cascade is connected to the output signal of the first frequency divider,
   the reset input of each DFFR in the cascade is connected to the first time-delayed clock signal,
   the logic input of each DFFR in the cascade after the first DFFR is connected to the logic output of the predecessor DFFR in the cascade, and
   the logic output of the N+1 digital logic circuit being high indicates the loss of the input clock signal.

8. The apparatus of claim 6, wherein the digital logic circuits are delay flip-flops with a reset function (DFFR), and
   the logic input of the first DFFR logic circuit in the cascade is a logic low or a Vss voltage,
   the clock input of each DFFR in the cascade is connected to the output signal of the first frequency divider,
   the reset input of each DFFR in the cascade is connected to the first time-delayed clock signal,
   the logic input of each DFFR in the cascade after the first DFFR is connected to the logic output of the predecessor DFFR in the cascade, and
   the logic output of the N+1 digital logic circuit being low indicates the loss of the input clock signal.

9. The apparatus of claim 1, wherein the PLL is an analog PLL (APLL) or a digital PLL (DPLL).

10. The apparatus of claim 1, wherein the first frequency divider output has the same frequency as the time-delayed clock signal.

11. An apparatus for detecting the loss of an input clock signal for a phase-locked loop (PLL), the apparatus comprising:
    (a) a time delay circuit that receives the input clock signal and outputs a first time-delayed clock signal;
    (b) a first frequency divider that receives an input signal from an internal clock of the PLL and outputs a clock signal having the same frequency or a lower frequency than that of the time-delayed clock signal; and
    (c) a digital logic circuit that receives the first frequency divider output signal and the first time-delayed clock signal and outputs a signal indicating the loss of the input clock signal if there is no first time-delayed clock signal for a cycle of the first frequency divider output signal.

12. The apparatus of claim 11, wherein the PLL is an analog PLL (APLL) or a digital PLL (DPLL).

13. The apparatus of claim 11, wherein the internal clock of the PLL is generated by one of a voltage-controlled oscillator (VCO) and a numerically-controlled oscillator (NCO).

14. The apparatus of claim 11, further comprising
(d) a second frequency divider that receives the first time-delayed clock signal and outputs a second time-delayed clock signal having a lower frequency or the same frequency as that of the first time-delayed clock signal, and wherein the digital logic circuit receives the first frequency divider output signal and the second time-delayed clock signal and outputs a signal indicating the loss of the input clock signal if there is no second time-delayed clock signal for a cycle of the first frequency divider output signal.

15. The apparatus of claim 11, wherein the first frequency divider output has the same frequency as the time-delayed clock signal.

16. A method of signaling a phase-locked loop (PLL)-based system to take a predetermined action upon the loss of the PLL input clock signal, the method comprising:
(a) generating a first time-delayed clock signal from an input clock signal of the PLL;
(b) generating an output signal from a first frequency divider that receives an internal clock signal from the PLL, the first frequency divider output signal having the same frequency or a lower frequency than that of the first-time delayed clock signal;
(c) generating an output signal from a digital logic circuit indicating the loss of the input clock signal if there is no first time-delayed clock signal for a cycle of the first frequency divider output signal, the digital logic circuit receiving the first frequency divider output signal and the first time-delayed clock signal; and
(d) outputting the digital logic circuit output signal to the PLL-based system, the PLL-based system configured to take the predetermined action upon receiving a predetermined value of the digital logic circuit output signal indicating the loss of the input clock signal.

17. The method of claim 16 wherein the predetermined action of step (d) is one of powering down the PLL chip, powering down a specific logic block in the PLL chip, and switching to a back-up PLL input clock.

18. The method of claim 16, wherein the predetermined value of the digital logic circuit output signal of step (d) is high or low.

19. The method of claim 16, wherein the PLL is an analog PLL (APLL) or a digital PLL (DPLL).

20. The method of claim 16, wherein the internal PLL clock signal of step (b) is generated by one of a voltage-controlled oscillator (VCO) and a numerically-controlled oscillator (NCO).

21. The apparatus of claim 1 wherein the signal outputted to indicate the loss of the input clock signal is a signal that changes from a first fixed logic level to a second fixed logic level.

22. The apparatus of claim 11 wherein the signal outputted to indicate the loss of the input clock signal is a signal that changes from a first fixed logic level to a second fixed logic level.

23. The method of claim 16 wherein the signal outputted to indicate the loss of the input clock signal is a signal that changes from a first fixed logic level to a second fixed logic level.

* * * * *